United States Patent

Suzuki

[11] Patent Number: 6,027,567
[45] Date of Patent: Feb. 22, 2000

[54] FLOW COATER WITH A TEMPERATURE CONTROLLER

[75] Inventor: Kenzo Suzuki, Sayama, Japan

[73] Assignee: Misuzu Co., Ltd., Tsurugashima, Japan

[21] Appl. No.: 08/725,817

[22] Filed: Oct. 7, 1996

[30] Foreign Application Priority Data

Oct. 13, 1995 [JP] Japan .................................. 7-290669

[51] Int. Cl.⁷ .................................................. B05C 5/00
[52] U.S. Cl. ..................... 118/600; 118/602; 118/300; 118/324; 118/DIG. 4
[58] Field of Search .............................. 118/DIG. 4, 600, 118/602, 324, 300; 134/105, 108; 165/DIG. 496, 163, 53

[56] References Cited

U.S. PATENT DOCUMENTS

| | | | |
|---|---|---|---|
| 3,602,193 | 8/1971 | Adams et al. | 118/315 |
| 3,875,899 | 4/1975 | Clements | 118/600 |
| 4,402,332 | 9/1983 | Bradshaw et al. | 134/105 |
| 4,605,059 | 8/1986 | Page | 165/163 |

FOREIGN PATENT DOCUMENTS 2140154  2/1973  Germany .................. 118/DIG. 4

*Primary Examiner*—Laura Edwards
*Attorney, Agent, or Firm*—Jones, Tullar & Cooper, P.C.

[57] ABSTRACT

In a flow coater for applying coating liquid to a plate member such as a printed board by a curtain flow method, a heat exchanger unit of a temperature controller is arranged in a collection tray which is arranged below a coating liquid supplying head across a conveyance path for the plate member. This heat exchanger unit has a coil-shaped structure. The coating liquid is caused to flow down curtainly from the head to come in contact with the heat exchanger unit in which the heat exchange is carried out. Since a small amount of coating liquid comes in contact with the heat exchanger unit, an excellent efficiency of the heat exchange can be obtained, and hence it is possible to cope speedily and accurately with temperature changes. In addition, since after the coating liquid has flowed down from the head, the coating liquid flows naturally down in the tray while contacting the heat exchanger unit, there is no need of providing a special drive apparatus therefor.

4 Claims, 2 Drawing Sheets

FLOW COATER WITH A TEMPERATURE CONTROLLER

BACKGROUND OF THE INVENTION

1. Field of the Invention

The present invention relates in general to a flow coater for coating a surface of a plate member such as a printed board with coating liquid such as photo resist liquid by causing the coating liquid to flow down onto the surface of the plate member curtainly, i.e., in the form of a curtain, and more particularly to a temperature controller for controlling the temperature of a coating liquid on which the change in property such as viscosity of the coating liquid depends on the plate member in order to control a thickness of a coating layer.

2. Description of the Related Art

A flow coater of this kind is constructed to employ the so-called curtain flow method wherein the coating is carried out in such a way that the coating liquid is caused to flow down curtainly through a gap of a nozzle of a supply head while a plate member is conveyed. In general, the flow coater is employed for the coating processing, such as surface coating, required for a plate member for use in a building material. In this case, the coating thickness depends on the property, such as viscosty, of the coating liquid, and in particular it is changed due to the variation of temperature of the coating liquid.

The temperature of the coating liquid is changed during coating as well as during vacation in the seasons and the variation of the ambient temperature in mornings and evenings. In particular, a pump for circulating the coating liquid is heated during the operation thereof and heat thus generated is transmitted to the associated portions. This results in a rise in the temperature of the coating liquid.

In order to suppress the temperature rise in the coating liquid, a large scale stirrer is installed in a supply tank so that the necessary work progresses while the coating liquid is continuously stirred. However, it is said that this is not sufficient for the coating processing. Therefore, management of the temperature of the coating liquid needs to be more positively carried out. For this reason, there is installed a temperature controller for either cooling or heating the coating liquid in correspondence with the change in the temperature of the coating liquid. In the temperature controller, the heat exchange is carried out between a temperature controlling medium such as water which is circulated from a supply source thereof and the coating liquid via a heat exchanger unit, thereby adjusting the temperature of the coating liquid. In this connection, conventionally, in general, there has been adopted a temperature controlling method wherein the heat exchanger unit is applied to the supply tank so that the coating liquid is cooled or heated properly by the temperature controller while monitoring the temperature of the coating liquid in the tank.

However, in the conventional method wherein the heat exchanger unit is applied to the supply tank in order to carry out the temperature control, there arises a problem in that it is impossible to carry out a temperature control corresponding speedily and accurately to the variation of the liquid temperature. This results because the capacity of the coating liquid in the tank is large, the responsibility of the heat exchanger unit is poor, and hence even when the coating liquid in the tank is stirred by a stirrer, the sufficient improvement can not be obtained. For this reason, the temperature control by the temperature controller can not sufficiently cope with the variation of temperature of the coating liquid which is supplied from the supply head onto the plate member. As a result, the property, such as the viscosity of the coating liquid, can not be stabilized, and hence it is impossible to obtain a uniform coating thickness.

In particular, in the case where the plate member to be subjected to coating processing is a printed board, and the photo resist liquid is applied as the coating liquid thereonto, since high accuracy is required for the thickness of the photo resist layer, in the case of utilization of the conventional temperature control, the product yield is poor and hence it is difficult to manufacture a printed board of high quality.

SUMMARY OF THE INVENTION

In view of the foregoing problems, the present invention was developed in order to solve the above-mentioned problems associated with the prior art, and it is therefore an object of the present invention to provide a flow coater including a temperature controller which is capable of controlling the liquid temperature of a coating liquid more speedily and accurately.

In order to attain the above-mentioned object of the present invention, according to an aspect of the present invention, there is provided a flow coater for coating a surface of a plate member, such as a printed board, with coating liquid, such as photo resist liquid, the flow coater including: a conveyance path extending substantially in a horizontal direction in order to convey the plate member; a coating liquid supplying head arranged above the conveyance path so as to be parallel to a transverse direction of the conveyance path, the coating liquid supplying head serving to cause the coating liquid to flow down curtainly onto the plate member while conveying the plate member along the conveyance path; a collection tray arranged below the coating liquid supplying head across the conveyance path so as to be parallel to the transverse direction of the conveyance path, the collection tray serving to collect the coating liquid which has flowed down from the coating liquid supplying head; and a temperature controller for controlling the temperature of the coating liquid.

The temperature controller includes a supply source for supplying therefrom a temperature control medium, and a heat exchanger unit to which the temperature control medium is circulatively supplied from the supply source, the heat exchanger unit serving to carry out heat exchange between the coating liquid and the temperature control medium, wherein the heat exchanger unit is arranged in a collection tray so as to contact the coating liquid which has flowed down from the coating liquid supplying head.

In addition, according to another aspect of the present invention, there is provided a flow coater wherein the heat exchanger unit has a pipe which is wound into a coil-shaped structure along a coil axis, the coil axis extending along a longitudinal direction of the collection tray.

In addition, there is provided a flow coater wherein the coils of the coil-shaped pipe constituting the heat exchange unit have substantially the same diameter, and also are in close proximity to one another as a result of winding the pipe thereinto.

Further, there is provided a flow coater wherein the coil-shaped pipe constituting the heat exchanger unit is placed on a bottom face of the collection tray, and the bottom face of the tray is tapered so as to slope down along a direction of flow of the coating liquid flowing in the tray.

Thus, the flow coater including the temperature controller according to the present invention is designed in such a way that the heat exchanger unit is arranged in the collection tray so as to directly contact the coating liquid which has flowed down from the coating liquid supplying head to carry out the heat exchange between the coating liquid and the heat exchanger unit. The reason that the above-mentioned construction is adopted is that unlike the capacity of the coating liquid accommodated in the tank, as for the coating liquid flowing down curtainly, the capacity thereof is small, and therefore the heat exchange efficiency is improved. As a result, a speedy and accurate temperature control is made possible.

In addition, the construction is adopted in which the heat exchanger unit, which is arranged in the collection tray, is obtained by winding the pipe into a coil-shaped structure, and the coil axis thereof extends along the longitudinal direction of the collection tray, whereby the contact area which is defined between the heat exchanger unit which is constituted by the coil-shaped pipe and the coating liquid which flows down naturally, becomes large, and hence the heat exchange therebetween can be more efficiently carried out. In addition, since the heat exchanger unit which is constituted by the coil-shaped pipe, matches in shape with the long and narrow collection tray, detachment of the heat exchanger unit from the collection tray as well as attachment of the heat exchange unit thereto can be readily carried out. Further, for the purpose of preventing the coating liquid from foaming when flowing down, a baffle plate or the like is normally provided in the collection tray. However, according to the present invention, the coil-shaped heat exchanger unit also acts as the baffle plate or the like, and hence the baffle plate or the like can be made unnecessary.

BRIEF DESCRIPTION OF THE DRAWINGS

Those and other objects, features and advantages of the invention will become more apparent upon a reading of the following detailed specification and drawings, in which.

DESCRIPTION OF THE PREFERRED EMBODIMENTS

The preferred embodiment of the present invention will hereinafter be described in detail with reference to the accompanying drawings.

Figure 1:
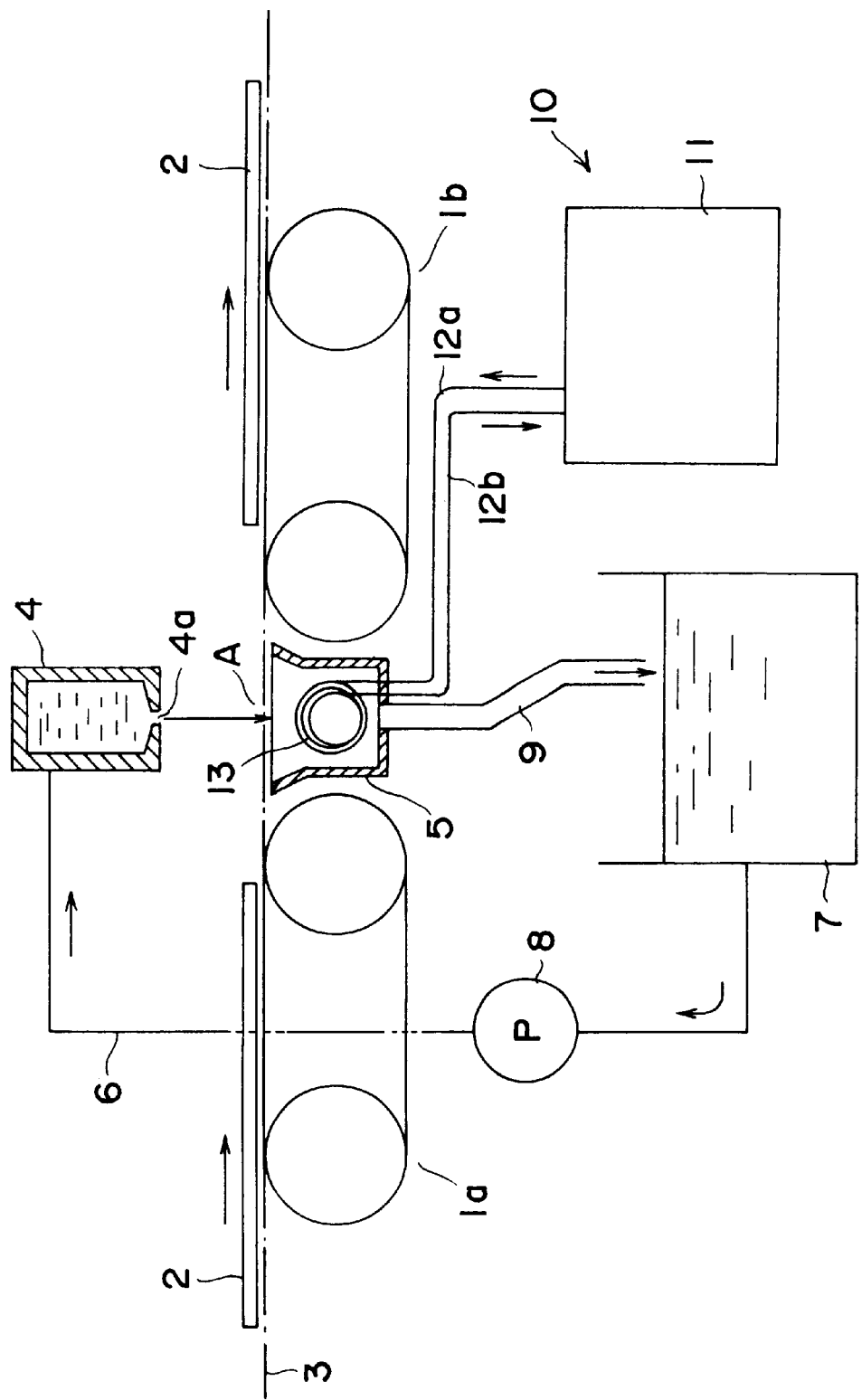
FIG. 1 is an overall schematic view showing a construction of an embodiment of a flow coater with a temperature controller according to the present invention.

Referring first to FIG. 1, there is illustrated the outline of the overall construction of a flow coater with a temperature controller according to the present invention. In FIG. 1, reference symbols 1a and 1b designate respectively a feeding site conveyance unit and a sending out site conveyance unit each including a pair of rollers and a belt for conveying a plate member 2, such as a printed board, along a conveyance path 3 in a direction indicated by the arrows. Reference numeral 4 designates a coating liquid supplying head which is arranged above the conveyance path 3 and in a transverse direction of the conveyance path 3 in a coating position A located in the middle between the conveyance units 1a and 1b. Reference numeral 5 designates a collection tray which is arranged in a transverse direction of the conveyance path 3 and below the supplying head 4 so as to be disposed between the feeding site conveyance path and the sending out site conveyance path.

The coating liquid supplying head 4 is connected to a coating liquid supplying tank 7 through a pipeline 6 so that the coating liquid accommodated in the tank 7 is supplied to the head 4 via the pipeline 6, as indicated by arrows, and a pump 8 installed in the middle of the pipeline 6. The coating liquid is caused to flow down curtainly, i.e., in the form of a curtain, from the head 4 with a suitable pressure applied to the coating liquid through a nozzle gap 4a as indicated by an arrow in FIG. 1, so as to be applied to a surface of the plate member 2 at the coating position A while the plate member 2 is conveyed, thereby subjecting the surface of the plate member 2 to the coating processing. Then, the remaining coating liquid is collected in the collection tray 5 and flows down naturally in the tray 5 to be returned to the supply tank 7 through a discharge pipe 9 as indicated by an arrow. In such a way, the coating liquid is circulatively supplied.

Reference numeral 10 designates a temperature controller of the flow coater according to the present invention. The temperature controller 10 includes, but is not limited to, a supply source 11 for supplying therefrom a medium such as cooled or heated water as a temperature controlling medium, and a heat exchanger unit 13 to which the temperature controlling medium is circulatively supplied through pipelines 12a and 12b from the supply source 11. The supply source 11 has the structure suitable for cooling or heating the medium, and hence may have the well known structure having a cooler and a heater self-contained therein or a heat pump employed therein.

The temperature controlling medium which has been cooled or heated is supplied from the supply source 11 to the heat exchanger unit 13 through a feeding site pipeline 12a as indicated by an arrow. Then, in the heat exchanger unit 13, heat exchange is carried out between the temperature controlling medium and the coating liquid. The temperature controlling medium is then returned to the supply source 11 through a sending out site pipeline 12b as indicated by an arrow.

The heat exchanger unit 13 is arranged in the collection tray 5. As a result, the coating liquid which flows down from the supply head 4 comes directly in contact with the heat exchanger unit 13, when falling to the collection tray 5, in which heat exchange therebetween is carried out. The temperature of the coating liquid is monitored at all times by a suitable temperature sensor (not shown) and the temperature control unit 10 is timely operated in correspondence with the variation of temperature to control the temperature of the coating liquid so that the temperature of the coating liquid always fulfills a fixed tolerance. Incidentally, since the structure in which the temperature control unit 10 is operated in conjunction with the temperature sensor is well known to those skilled in the art, the detailed description thereof is omitted here for the sake of simplicity.

As described above, since heat exchange is carried out between the heat exchanger unit 13 arranged in the collection tray 5 and the coating liquid which has flowed down curtainly, and hence the capacity of the coating liquid contacting the heat exchanger unit 13 is small, and heat exchange can be carried out with high efficiency. In addition, since the coating liquid comes in contact with the heat exchanger unit 13 after flowing down from the head 4, and then naturally flows down successively from the collection tray 5 to be sent to the tank 7, no special drive means for causing the coating liquid to flow is required at all in this case. In addition, since the heat exchanger unit 13 arranged in the collection tray 5 also acts as a baffle plate, the purpose of preventing the coating liquid from foaming can be attained, and hence there is no need of specially providing the baffle plate or the like.

Figure 2:
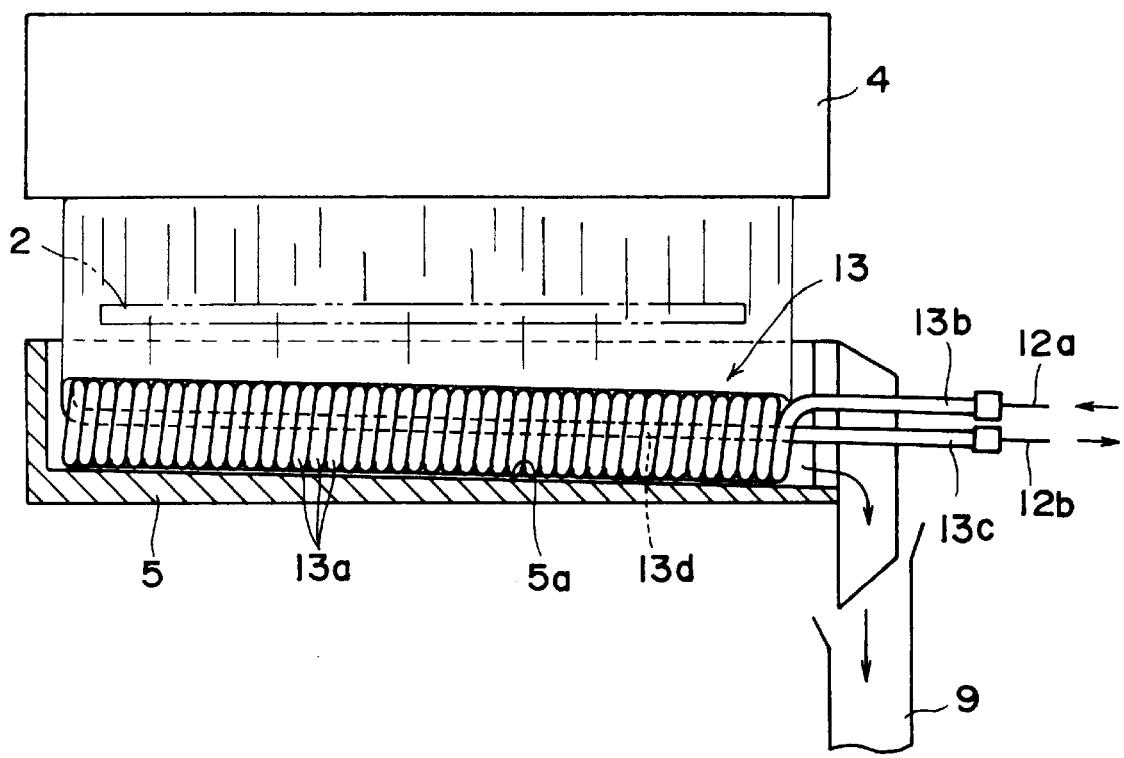
FIG. 2 is an enlarged view of a main portion showing the details of a collection tray and a coil-shaped heat exchanger unit arranged therein of the flow coater shown in FIG. 1.

Referring to FIG. 2, there is illustrated an enlarged view showing a concrete construction of a main portion of the heat exchanger unit 13. As shown in FIG. 2, the heat exchanger unit 13 is constructed by winding a pipe into a coil-shaped structure. Individual coils 13a constituting the heat exchanger unit 13 have substantially the same diameter, and also are in close proximity to one another as a result of winding the pipe thereinto. In this connection, the heat exchanger unit 13 thus constructed is arranged in the collection tray 5 so that the coil axis is parallel to the longitudinal direction. Now, the heat exchanger unit 13 has only to be placed on a bottom face 5a of the tray 5. Therefore, when carrying out the cleaning or the like, the heat exchanger unit 13 can be simply detached from the tray 5. As shown in the figure, the bottom face 5a of the tray 5 is slightly tapered so as to slope down along the flow direction of the coating liquid flowing in the tray 5. As a result, the coating liquid flows down naturally in the tray 5. In addition, as shown in the figure, a length of the coil-shaped heat exchanger unit 13 is set to be substantially the same length as the curtain width of the coating liquid so that the heat exchanger unit 13 can contact the coating liquid, throughout the curtain length thereof, which has flowed down from the supply head 4.

The coating liquid which has flowed down from the supply head 4 reaches the upper portion of each coil 13a of the coil-shaped heat exchanger unit 13 and then flows down along the outer peripheral surface of each coil 13a or flows into the inside space defined by the coils 13a to contact with the whole peripheral surface of each coil in order to carry out the heat exchange between the coating liquid and the heat exchanger unit 13, and then falls to the bottom face 5a of the tray 5 successively to flow out along the bottom face 5a as indicated by an arrow.

Therefore, since heat exchange can be carried out between a small amount of coating liquid and the heat exchanger unit 13 having a large surface area, the efficiency of the heat exchange is excellent and also the temperature gradient between the temperature controlling medium and the coating liquid can be set to a small value. This results in the stability of the liquid temperature being further enhanced. In addition, there is no need of providing a special liquid drive means for causing forcedly the coating liquid to flow around the heat exchanger unit 13.

One end portion 13b of the coil-shaped heat exchanger unit 13 is connected to a feeding site pipeline 12a and the other end portion 13c thereof is connected to a sending out site pipeline 12b. Therefore, the temperature control medium which has flowed in through the feeding site pipeline 12a as indicated by an arrow flows through the outer side coils and then flows through a return site pipe 13d, which is arranged in the inside space defined by the coils 13a so as to extend parallel to the axis, to flow out to the sending out site pipeline 12b.

As described above, since the return side pipe 13d through which the temperature control medium is returned to the supply source 11 is arranged in the inside defined by the coils 13a, and coils 13a into which the temperature control medium flows are arranged in the outside of the pipe 13d, heat exchange can be carried out more efficiently.

While the present invention has been described particularly with respect to the preferred embodiment thereof, it is to be understood that in addition to the flow coater for carrying out the coating of the printed board, the present invention may also be applied to a flow coater for the surface coating of an ordinary building material or the like.

In addition, as shown in FIG. 2, the heat exchanger unit 13 preferably has the coil-shaped structure. However, in addition thereto, the heat exchanger unit 13 may also have other shapes such as a shape which is obtained by bending a pipe into a snake's belly shape. In addition, there may be adopted a structure in which multiple fins are provided on the outer periphery of the pipe. Accordingly, this description is not intended to be construed in a limiting sense, and therefore it is to be understood that the various changes and modifications will occur to those skilled in the art without departing from the scope and true spirit of the invention.

As set forth hereinabove, according to the present invention, since the heat exchanger unit of the temperature control unit of the flow coater according to the present invention is arranged in the collection tray so as to contact the coating liquid which has flowed down curtainly, heat exchange is carried out between a small amount of coating liquid and the heat exchanger unit having a large surface area. Therefore, heat exchange can be carried out much more efficiently, and it is possible to cope speedily and accurately with changes in the temperature of the coating liquid, and hence the temperature of the coating liquid can be stably controlled. In addition, since it is utilized that the coating liquid flows naturally down in the collection tray after it has flowed down to the bottom face of the tray while contacting the heat exchanger unit, special drive means therefor are not required at all. Further, since the heat exchanger unit arranged in the collection tray acts also as a baffle plate or the like for preventing occurrence of the undesirable foam or the like of the coating liquid, there is no need of providing specially a baffle plate or the like, and hence attachment of the heat exchanger unit as well as detachment thereof can be readily carried out.

What is claimed is:

1. A flow coater for coating a surface of a plate member with coating liquid, said flow coater comprising: means defining a conveyance path extending substantially in a horizontal direction in order to convey the plate member; a coating liquid supplying head arranged above the conveyance path and extending parallel to a transverse direction of the conveyance path, said coating liquid supplying head containing a coating liquid which flows down curtainly onto the plate member while the plate member is conveyed along the conveyance path; a pipeline, a coating liquid supplying tank connected to said coating liquid supplying head through said pipeline; a pump for supplying the coating liquid accomodated in the coating liquid supplying tank to said coating liquid supplying head through said pipeline; a collection tray arranged below said coating liquid supplying head across the conveyance path so as to be parallel to the transverse direction of the conveyance path, said collection tray serving to collect the coating liquid which has flowed down from said coating liquid supplying head, and returning the coating liquid to the supplying tank through a discharge pipe; and a temperature controller for controlling the temperature of the coating liquid, wherein said collection tray has a bottom face, and said coil-shaped pipe constituting said heat exchanger unit is placed detachably on the bottom face of said collection tray, and the bottom face of said collection tray is tapered so as to slope down along a direction of flow of the coating liquid flowing in said collection tray;

wherein said temperature controller includes:
a supply source for supplying therefrom a temperature control medium, and
a heat exchanger unit to which the temperature control medium is circulatively supplied from said supply source, said heat exchanger unit serving to carry out the heat exchange between the coating liquid and the temperature control medium;

wherein said heat exchanger unit is arranged in said collection tray so as to directly contact the coating liquid which has flowed down curtainly from said coating liquid supplying head; and wherein said heat exchanger unit has a pipe which is wound into a coil-shaped structure along a coil axis, said coil axis extending along a longitudinal direction of said collection tray.

2. A flow coater according to claim 1, wherein said coils of said coil-shaped pipe constituting said heat exchange unit have substantially the same diameter, and also are in close proximity to one another as a result of winding said coil-shaped pipe into a coil-shape.

3. A flow coater according to claim 1, wherein said plate member comprises a printed board.

4. A flow coater according to claim 1, wherein said coating liquid comprises photo resist liquid.

\* \* \* \* \*